(12) United States Patent
Doyle

(10) Patent No.: US 7,384,165 B2
(45) Date of Patent: Jun. 10, 2008

(54) WATER FEATURE WITH AN LED SYSTEM

(76) Inventor: Kevin Doyle, 15767 Morton Bay Ct., Detroy Beach, FL (US) 33446

( * ) Notice: Subject to any disclaimer, the term of this patent is extended or adjusted under 35 U.S.C. 154(b) by 124 days.

(21) Appl. No.: 11/172,978

(22) Filed: Jul. 5, 2005

(65) Prior Publication Data

US 2007/0008713 A1    Jan. 11, 2007

(51) Int. Cl.
*F21V 33/00* (2006.01)

(52) U.S. Cl. .................. 362/101; 362/96; 362/145; 362/253; 362/555

(58) Field of Classification Search ............... 362/101, 362/555, 96, 253, 145, 562, 249, 227, 645, 362/646; 239/16, 18
See application file for complete search history.

(56) References Cited

U.S. PATENT DOCUMENTS

| | | | |
|---|---|---|---|
| 4,749,126 A | 6/1988 | Kessener et al. | |
| 5,119,279 A | 6/1992 | Makowsky | |
| 5,165,778 A | 11/1992 | Matthias et al. | |
| 5,207,499 A | 5/1993 | Vajda et al. | |
| 5,211,469 A | 5/1993 | Matthias et al. | |
| 5,890,794 A | 4/1999 | Abthai et al. | |
| 5,927,845 A | 7/1999 | Gustafson et al. | |
| 6,021,960 A | 2/2000 | Kehat | |
| 6,076,741 A | 6/2000 | Dandrel et al. | |
| 6,126,290 A | 10/2000 | Veigel | |
| 6,132,056 A | 10/2000 | Ruthenberg | |
| 6,184,628 B1 | 2/2001 | Ruthenberg | |
| 6,196,471 B1 | 3/2001 | Ruthenberg | |
| 6,203,173 B1 | 3/2001 | Duff et al. | |
| 6,305,618 B1 | 10/2001 | Lin | |
| 6,360,380 B1 | 3/2002 | Swart et al. | |
| 6,375,342 B1 | 4/2002 | Koren et al. | |
| 6,393,192 B1 | 5/2002 | Koren | |
| 6,447,137 B1 | 9/2002 | Long | |
| 6,460,102 B1 * | 10/2002 | Choi | 710/110 |
| 6,484,952 B2 | 11/2002 | Koren | |
| 6,543,925 B2 | 4/2003 | Kuykendal et al. | |
| 6,595,675 B2 | 7/2003 | Dongo | |
| 6,616,291 B1 | 9/2003 | Love | |
| 6,637,676 B2 | 10/2003 | Zieger et al. | |
| 6,752,517 B2 | 6/2004 | Hilderbrand et al. | |
| 2003/0048632 A1 * | 3/2003 | Archer | 362/101 |
| 2003/0224729 A1 * | 12/2003 | Arnold | 455/59 |
| 2004/0032749 A1 * | 2/2004 | Schindler et al. | 362/555 |
| 2005/0248944 A1 * | 11/2005 | Sloan | 362/251 |

* cited by examiner

*Primary Examiner*—Sandra O'Shea
*Assistant Examiner*—Mark Tsidulko
(74) *Attorney, Agent, or Firm*—Tangent Law Group; Eric J. Weierstall, Esq.

(57) ABSTRACT

A water feature having a housing with an electronics section and a water channel. A printed circuit board with an at least one light emitting diode (LED) where at least a portion of the at least one LED is in direct contact with the water while the electrical section remains waterproof.

35 Claims, 7 Drawing Sheets

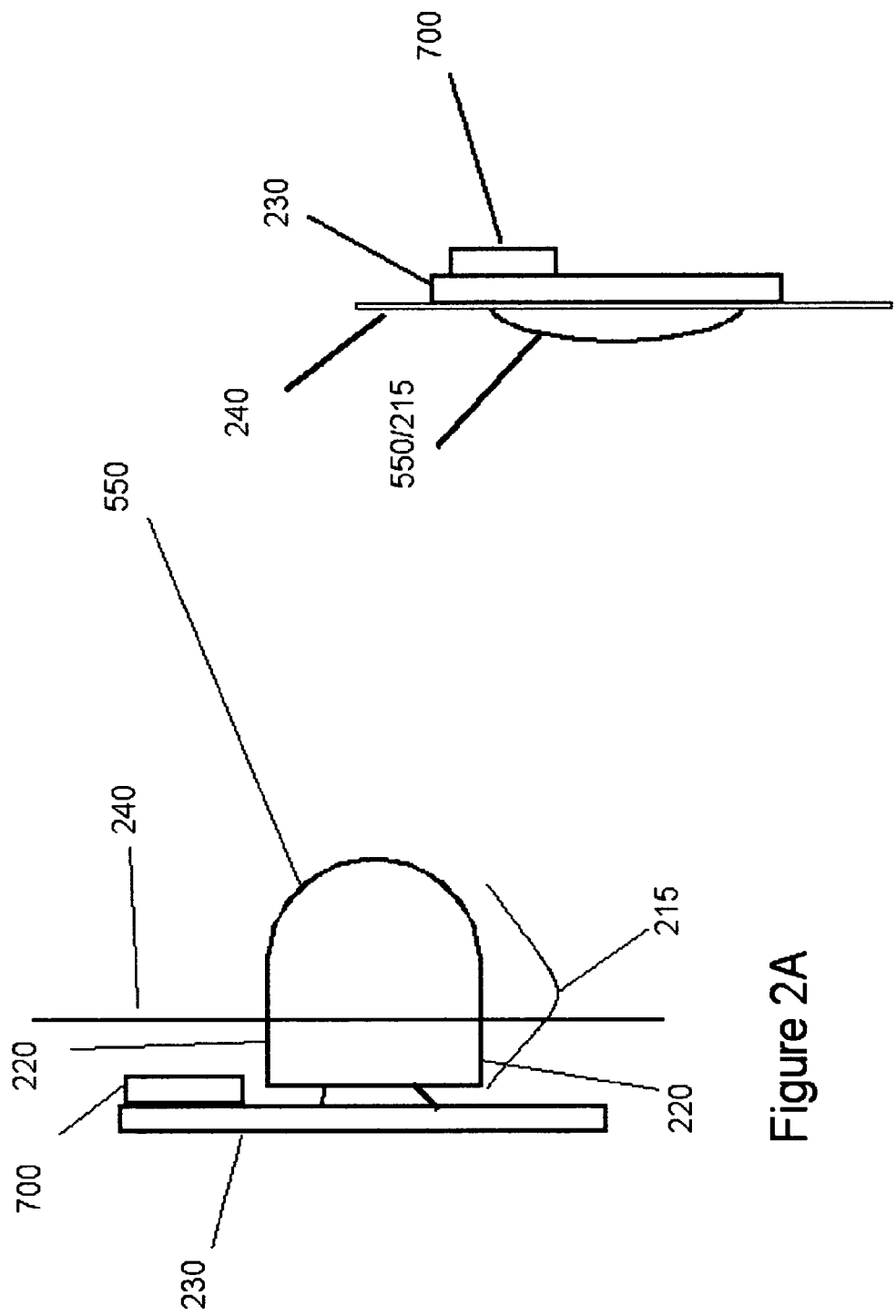

WATER FEATURE WITH AN LED SYSTEM

BACKGROUND OF THE INVENTION

1. Field of the Invention

The invention generally relates to an apparatus and method for lighting water in a water feature, particularly for lighting water with Light Emitting Diodes (LEDs) at least partially in direct contact with the water.

2. Background of the Invention

Increasingly, the popularity of using water as an integral part of domestic landscaping has moved landscapers to include greater numbers of decorative water features. These features are incorporated in swimming pools, spas, ponds, lakes, and other water features and sources in the typical yard. In addition to domestic landscaping, commercial landowners have also been following the trend toward more decorative water elements through fountains, pools, ponds, lakes and such. In response, companies have developed a myriad of features that span the range of naturally occurring water features, such as faux waterfalls complete with jutting rock outcroppings, to more artistic endeavors, like dancing water spouts and jets.

In addition to the natural beauty associated with these features, by applying the proper lighting the beauty of these water features can be extended to include evening viewing. From underwater lighting in pools to back lighting fountains, landscapers have been striving to continue improving how these features are lit.

In relation to lighting water features, some of the earliest attempts to illuminate such water features were made by reflecting high intensity light from light sources which were generally hidden from view or directed onto the feature. While such illumination effects can be quite cost effective, the available light is not used efficiently and the visual effect that results from the light that is reflected to the eye is minimal. Too much of the light is either transmitted past the jets or through the jets. In addition since the light sources must be located in or around or closely adjacent to the water features, it is often the case that, from particular positions around the feature, an observer would be overcome by the intensity of the lights around the feature. This of course would impair the view of the feature and the overall aesthetic.

Several other attempts have been made in the past whereby high intensity light is caused to pass into a chamber from which it passes directly into the stream of the water feature. Using conventional high intensity bulbs in a water tight chamber the light is projected from the chamber towards an outlet or series of lenses leading to an outlet. These attempts include conventional, high intensity pool lighting which uses a watertight compartment to contain a high intensity bulb and passes the light through a lens, such as that seen in U.S. Pat. No. 6,203,173 to Duff et al. In these instances however the light source is located outside the fluid stream and light must be shone into a housing and then passed out into the water. These transmission box arrangements are clumsy and bulky and there is considerable light loss due to transmission losses. These losses occur as the light enters the water tight chamber and on through the lens to the outlet due to dispersion, reflection, and refraction.

Similarly, attempts have been made to include the light enclosures directly in the water channel or pool, effectively moving from a transmission box to a watertight enclosure to contain the high intensity lamp in the water. Such devices are shown in U.S. Pat. No. 4,749,126 to Kessener, et al. and U.S. Pat. No. 6,447,137 to Long. However, these devices simply extended the watertight chamber concept further into the path of the water. While this increases luminosity due to the increased surface area of the enclosure, significant transmission losses still occur due to the space in the watertight enclosure placed around the high intensity lamp. In addition, the location of the lighting system inside the water feature makes the necessary and frequent replacement of bulbs in such systems difficult and costly to manage.

Several innovations using fiber optic lighting systems have been utilized to achieve eye-catching coloration of water features. For instance, U.S. Pat. No. 6,595,675 to Dongo, U.S. Pat. No. 6,375,342 to Koren et al, U.S. Pat. Nos. 6,393,192 and 6,484,952 to Koren, and U.S. Pat. No. 6,132,056 to Ruthenberg show various features with fiber optic lighting systems. However, these fiber optically lit features suffer significantly from the lower luminescence of the transmitted light from the light pump to the tips of the fiber optics, as there are transmission losses and the tips act only as point light sources. In addition to the luminosity problems, the fiber optic lighting systems are costly and significantly more difficult to install and maintain than conventional lights. The fiber optic fibers are very delicate, susceptible to damage even from a slight impact, which makes proper installation difficult. To compound this problem, repair of the individual fibers is extremely difficult and costly. Similar problems exist with maintenance of such features.

To date no feature has been able to achieve the desired superior luminescence and coloring while maintaining durability, increasing dependability, increasing ease of maintenance, and remaining cost effective. There exists a need to provide safe and cost effective water feature lighting with a greater luminescence within the water feature. There should also be a greater ability to control and color the water features, including the ability to color wash and transition between colors within a feature.

SUMMARY OF THE INVENTION

An object of the invention is to provide higher luminosity light in water features with an LED lighting system.

An object of the invention is to provide higher intensity Light Emitting Diodes without diminishing their operational life through the additional cooling provided by direct contact with the water in the water feature.

An object of the instant invention is to provide illumination of water features by using light emitting diodes which are placed inside the water feature or inserted from the outside of the water feature with the tips of the LEDs exposed directly to the water, using the water as a means of cooling the LEDs and preventing them from overheating and shortening the life of the LEDs.

A still further object of the instant invention is to provide a system for exposing LEDs directly to the water in a water feature to provide better light transfer into the water, which yields better illumination of the water feature and the ability to wash several colors through the feature.

The apparatus of the invention includes a water feature having a housing with an electronics section and a water channel. A printed circuit board is provided and coupled to an at least one light emitting diode (LED) with at least a portion of the at least one LED is in direct contact with the water while the electrical section remains waterproof. The water feature can be, for example, an at least one of a nozzle, a jet, a funnel, a fountain, a waterfall, a laminar jet, a bubbler, a cascade fountain, a water sheet, a water curtain feature, a pool, a spa, a tub, a pond, a sprinkler, or a water cannon. The water feature can be in or on a swimming pool, spa, pond, lake, or fountain.

The water feature of claim can include a barrier member between the printed circuit board and the at least one LED, where the portion of the LED in direct contact with the water extends through the barrier member. The water feature can also include a waterproof compound filling the electronics section. The water feature having both a waterproof barrier member between the printed circuit board and the at least one LED, wherein the portion of the LED that is in contact with the water protrudes through the barrier member and having the electronics section filled with a waterproof compound. The water feature the barrier member can be comprised of one of a plastic, rubber or a composite material. The waterproof compound filling the electronics section can encase the components held within the electronics section up to the barrier member.

The at least one LED can be an at least one of a high intensity and a super-high intensity LED, a through mount, surface mount, PC mount, panel mount LED, one of a single color, multi-color, and multiple color LED, a flashing LED, a non-flashing LED, an LED array. The at least one LED array can be, for instance, at least one of a single color LED array, a multi-color LED array, a multiple color LED array, a poly-LED array, and a cluster LED array. The water feature can be submerged in a body of water or the water feature can be coupled to a body of water. The at least one LED in contact with the water can extend from the electronics section through the housing to the water channel.

The water feature can also have a controller. The controller can be mounted on the printed circuit board. The controller can also be external to the water feature and coupled to the printed circuit board to control the at least one LED. The controller can be coupled by terrestrial wire or can be wirelessly coupled to the printed circuit board. The external controller can be coupled to a plurality of water features and control them simultaneously.

The method of the invention includes method of lighting a water feature with an LED lighting system including the method steps of placing an at least one LED on a printed circuit board, applying a barrier member that separates the printed circuit board 230 from the water in the water feature, inserting the printed circuit board with the at least one LED into a water feature with a water, positioning the printed circuit board within the water feature such that at least a portion of the at least one LED is in direct contact with the water, passing water through the water channel and illuminating the at least one LED via a low-voltage electrical circuit coupled through the printed circuit board.

The method can also include the step of controlling the at least one LED. The step of controlling the at least one LED can include controlling the at least one LED to vary the output of the at least one LED and achieve a lighting effect. The method can further include the step of sealing off from the water the portion of the LED and the printed circuit board not in contact with the water. The step of sealing off from the water channel the portion of the LED and printed circuit board not in contact with the water channel further can include the step of encasing the LED and printed circuit board not in contact with the water channel in a waterproofing material. The method can further include the step of coating the board with a conforming coating.

Moreover, the above objects and advantages of the invention are illustrative, and not exhaustive, of those which can be achieved by the invention. Thus, these and other objects and advantages of the invention will be apparent from the description herein, both as embodied herein and as modified in view of any variations which will be apparent to those skilled in the art.

BRIEF DESCRIPTION OF THE DRAWINGS

Embodiments of the invention are explained in greater detail by way of the drawings, where the same reference numerals refer to the same features.

FIG. 2A shows a close up cross-sectional view of an exemplary embodiment of some of the electronics components of the instant invention.

FIG. 2B shows a still further close up cross-sectional view of a still further exemplary embodiment of some of the electronics components of the instant invention.

DETAILED DESCRIPTION OF THE INVENTION

The instant invention is directed to a water feature having an LED system with at least a portion of the LED in direct contact with the water. In the exemplary embodiments, at least one LED is at least partially in direct contact with the water, for instance as it flows through a jet, nozzle, bubbler, water sheet, rests in a pool or is similarly held in a water feature. The LED system can be run at higher intensities, since the water in the water feature acts as a very large heat sink to remove the additional heat from higher intensity. This direct contact also improves luminosity and allows for a wide variety of color changes not possible in heretofore known lighting systems. These color changes can be changed in such a way that provides a very specific and hereto for unachievable color washing effect, such that the water feature, for instance a waterfall, laminar water tube, jet, bubbler, water sheet, fountain, pool, or similar feature, can be different colors at the same time across the length of the feature.

Figure 1:
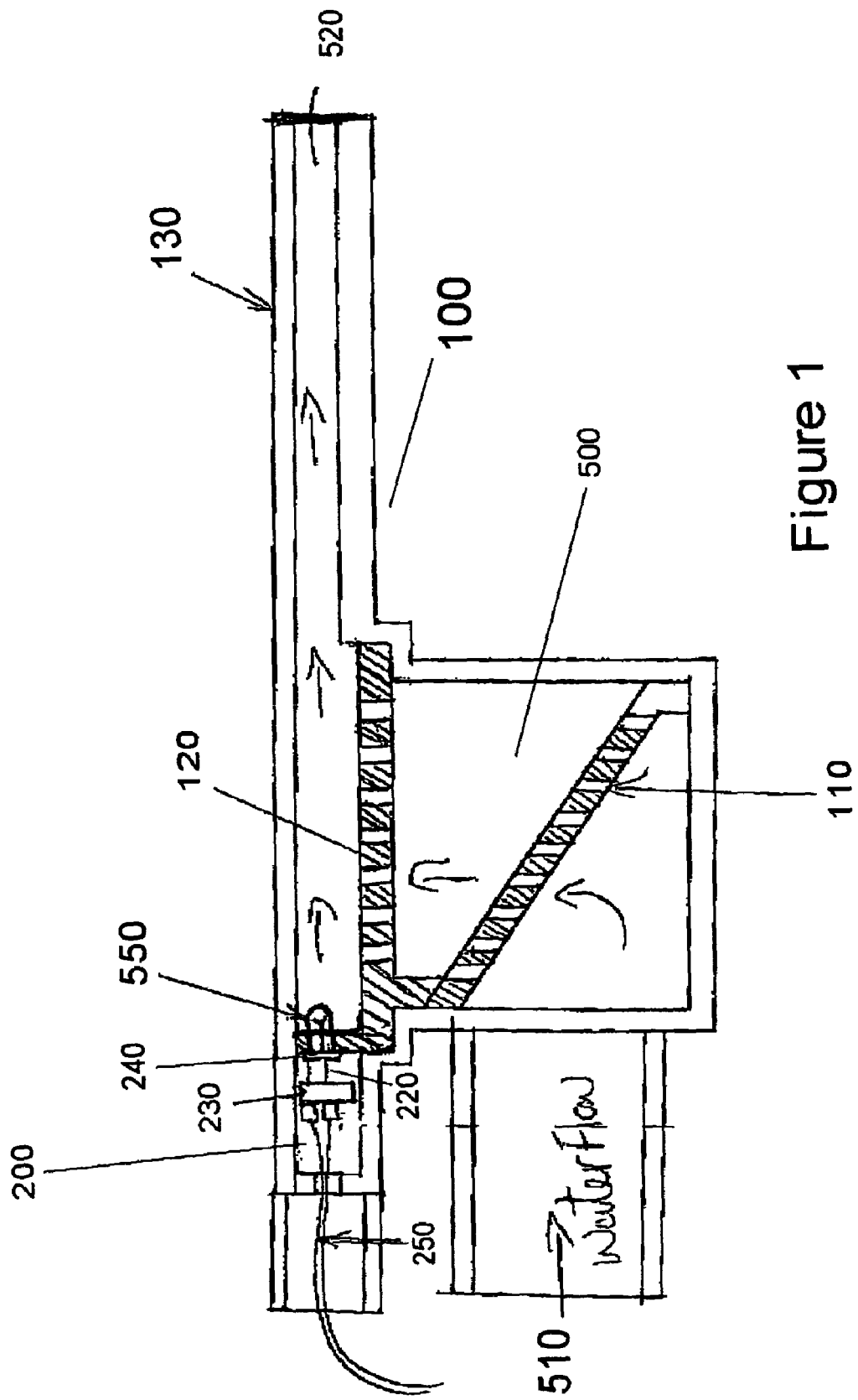
FIG. 1 illustrates a cross-sectional view of an exemplary embodiment of a water feature employing the instant invention.

FIG. 1 illustrates a cross-sectional view of an exemplary embodiment of a water feature employing the instant invention. As mentioned, the Light Emitting Diode (LED) lighting system of the instant invention can be used in just about any water feature where it can be fitted. The LED may be of any type, including, but not limited to: high intensity LEDs, super-high intensity LEDs, through mount LEDs, surface mount LEDs, panel mount LEDs, PC mount LEDs, single color LEDs, multi-color LEDs, multiple colors LEDs, flashing LEDs, non-flashing LEDs, LED arrays, single color LED arrays, multi-color LED arrays, multiple color LED arrays, poly-LEDs, cluster LEDs, or similar LEDs These LEDs can be utilized individually or together in any combination in the instant invention, depending on the desired lighting effect.

In the exemplary embodiment of FIG. 1, the water feature 10 is designed to provide a sheet effect, like a waterfall. The water feature 10, in this case, may be above ground or in a pool or other water source or feature. Additional exemplary embodiments of water features can utilize the same or similar embodiments of the invention. These can include, but are not limited to, nozzles, jets, funnels, fountains, waterfalls, laminar jets, bubblers, cascade fountains, water sheets, waterfalls, water curtain features, pools, spas, tubs, ponds, sprinklers, water cannon, and similar water features. Some further non-limiting examples of some of these exemplary embodiments of the instant invention are shown in the water features depicted in FIGS. 4-8.

In the exemplary embodiment depicted, the water feature creates a sheet of water as its primary attraction as shown at its outlet 520. An at least one LED 215 is installed inside a housing 100 of the water feature 10. The water feature housing 100 has a water inlet 510 into which water is circulated from the return of a pool pump (not shown) creating a water channel 500. The water used can be filtered and in this exemplary embodiment it is carried through a baffle system 110,120. The baffle system 110,120 is used to slow the water flow down and give it certain flow properties. Further exemplary embodiments may omit the baffles or use modified baffles to provide different flow characteristics.

A printed circuit board 230 is mounted in an electronics section 200. The at least one LED 215 is mounted to the printed circuit board 230. Multiple printed circuit boards may also be mounted as part of the LED system. These printed circuit boards may, for example, mount single LEDs, rows of LED's, LED's laid out in staggered or geometric shapes and arrays or any other configuration to suit the water feature and its design constraints. The at least one LED 215 can also be installed in any pattern on the printed circuit board depending on desired lighting effect in the water feature and the shape of the water feature and similar design constraints. As mentioned, any combination of an at least one LED 215 may be utilized in the exemplary embodiment.

Figure 3:
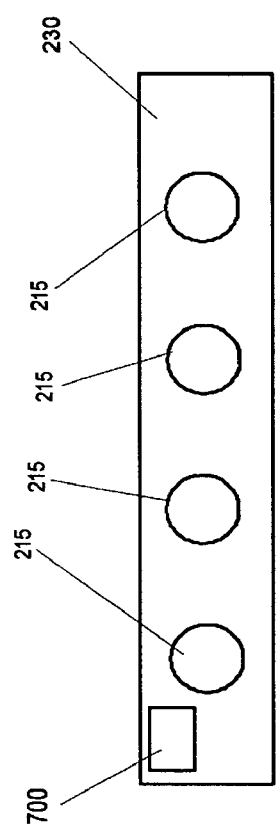
FIG. 3 shows a front view of an exemplary embodiment of the electronic components of the instant invention.

However, in the exemplary embodiment as, shown in FIGS. 1-3, has a combination of red, white, blue, and green LEDs are controlled by a controller 700 with a digital circuit that comprises, in part, a microprocessor that gives instructions and controls the at least one LED 215, here a plurality of LEDs, to blend different colors to obtain many different colors variations in the water. Alternatively, the at least one LED 215 can be controlled from electronics which are independent of the particular water feature, for instance from a master controller 7000 as shown and further described in relation to FIG. 8.

In the exemplary embodiments shown, a low voltage circuit will drive the at least one LED 215 to help ensure safety. Using a low voltage in the circuit reduces the possibility of severe injury if the circuit should short through the water feature and/or the water. The printed circuit board 230 is positioned in the water fixture 10 in an electronics section 200. The at least one LED 215, in this case the array of LEDs, is positioned on the printed circuit board 230. A barrier sheet 240 having a respective hole in it for each of the at least one LEDs 215 is then affixed between the electronics section 200 and the water channel 500.

The at least one LED 215 is comprised in part of a lens component 550. The LEDs lens component 550 can be made from, but is not limited to, glass, ceramic, plastic, or other appropriate material. The lens component 550 of the at least one LED 215 extends at least partially though the barrier sheet 240 and is positioned so that it is in contact with the water in the water channel 500 of the water feature 10 in the exemplary embodiment shown. In FIG. 1, about two thirds of the lens component 550 will be exposed to the water in the water channel 500 of the water feature 10 for better transfer of light into the water and for enhanced cooling.

The at least one LED 215 mounted on the printed circuit board 230 with the barrier sheet 240, is placed inside the electronics section 200 of the water feature 10 and held in place and potted to secure and water proof the electrical components of the unit in the electrical section 200 of the water feature 10. The electronics section 200, in the exemplary embodiment shown, can be used to seal off the printed circuit board 230 and any other components that cannot come into contact with the water. The elements behind the barrier sheet 240, in this instance a portion of the at least one LED 215, the circuit board 230 and its controller 700 and an electrical coupling 250, are protected from the water channel 500. To further enhance the waterproofing, the printed circuit board may be coated with a separate waterproofing material, for instance via a conformal coating.

The electronics section 200 can also be filled with a waterproofing compound 270, for example a two-part epoxy, as shown in FIG. 1. Once the waterproofing compound 270 sets it will provide additional waterproofing, beyond that provided by the barrier sheet 240, and secure the components in the electronics section 200 as well as adhere to the barrier sheet 240. This fixing process also provides for improved longevity and reliability in the electronics.

The lens component 550 of the at least one LED 215, in this case a plurality of LEDs, remains outside of the electronics section 200 and is left to contact the water in the water channel 500. The light from the at least one LED then travels through the water flow in the water channel 500 and out the outlet 520 into the water feature, illuminating the water feature. The installation of the instant invention provides maximum exposure of the at least one LED 215 to the water. This allows the full luminosity of the at least one LED 215 to be used in providing a desired coloring or lighting effect in the water because the transfer of light in the water is more efficient and effective than any alternative or existing systems. The is due to the placement of the light source in direct contact with the water as opposed to systems where the light source, e.g. a fiber optic light pump or conventional lights in waterproof containment, is separated from the water in the water feature by some distance.

In addition the at least one LED 215 is exposed directly to the cooler water which helps with thermal dissipation, cooling down the LEDs and allowing the LEDs to be run at higher intensity with correspondingly higher operating temperatures. This results in brighter, more vivid coloration than heretofore known lighting systems. In addition, the instant invention is also easier to install and significantly more cost effective than heretofore known solutions. Furthermore, the use of the at least one LED 215 in direct contact with the water flow also allows for a greater variety of color changes. In addition to providing known, abrupt changes in the colors in the water feature, these color changes can now be changed in such a way as to provide a color washing effect, such that the water feature, for instance a waterfall, can be different colors at the same time.

FIG. 2A shows a close up cross-sectional view of an exemplary embodiment of some of the electronics components of the instant invention. The figure shows the relation of the barrier sheet 240 to the printed circuit board 230. In the embodiment shown, the printed circuit board 230 mounts both an at least one LED 215 and a controller 700 on the board. In this embodiment, the at least one LED 215 is a through mount LED with a lens component 550 that is segmented by the barrier sheet, having a "dry side" 220 and a "wet side" 550. The wet side is the part of the lens component 550 that is eventually placed in contact with the water of the water feature 10. The remaining electronic components and dry side 220 of the lens component are contained in the electronics section 200, as seen in FIG. 1. These components can be encapsulated by the waterproofing material 270, as shown in FIG. 1. This exemplary embodiment of the electronics components of the instant invention can be utilized within any of the water features mentioned herein, alone or in conjunction with further exemplary embodiments of the electronics or additional electronics components. The at least one LED 215, may be one or any combination of the LEDs discussed herein. Similarly, the board configuration depicted in may be modified to suit the water feature design constraints and multiple boards may be utilized without departing from the spirit of the invention.

FIG. 2B shows a still further close up cross-sectional view of a still further exemplary embodiment of some of the electronics components of the instant invention. In this embodiment, the barrier sheet 240 is surface mounted and adhered to one side of the printed circuit board 230. The board also has an at least one LED 215 surface mounted flush to the board and protruding through the barrier sheet 240. This surface mounted LED 215 puts the entire lens component 550 of the at least one LED 215 in contact with water when employed in the water feature 10. This exemplary embodiment of the electronics components of the instant invention can be utilized within any of the water features mentioned herein, alone or in conjunction with further exemplary embodiments of the electronics or additional electronics components. The at least one LED 215, may be one or any combination of the LEDs discussed herein. Similarly, the board configuration depicted may be modified to suit the water feature design constraints and multiple boards may be utilized without departing from the spirit of the invention.

FIG. 3 shows a front view of an exemplary embodiment of the electronic components of the instant invention. The printed circuit board 230 with a controller 700 is shown. The at least one LED 215 is shown as an array of four LEDs. This LED array having the at least one LED 215 can be comprised of single color LEDs, for instance the red, green, blue, and white LEDs of the exemplary embodiment of FIG. 1. The LEDs could also be multi-color LEDs or any combination of the LEDs discussed herein. This exemplary embodiment of the electronics components of the instant invention can be utilized within any of the water features mentioned herein, alone or in conjunction with further exemplary embodiments of the electronics or additional electronics components. Similarly, the board configuration depicted may be modified to suit the water feature design constraints and multiple boards may be utilized without departing from the spirit of the invention.

Figure 4:
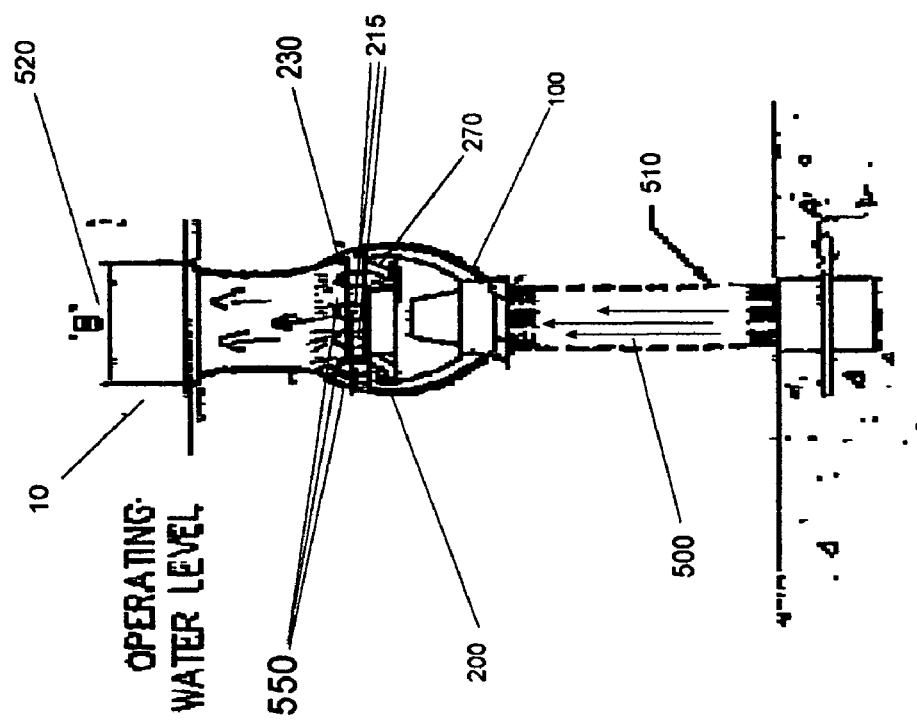
FIG. 4 shows a cross-sectional view of a further exemplary embodiment of the instant invention.

FIG. 4 shows a cross-sectional view of a further exemplary embodiment of the instant invention. The exemplary embodiment of a water feature 10 depicted in FIG. 4 is a submerged jet, the feature resting just below the surface of a pool. The jet water feature 10 has a housing 100, including a water inlet 510 wherein water is pumped in through piping. The printed circuit board 230 is provided as a circular board with a circular cutout, a doughnut shaped board. The printed circuit board 230 has an at least one LED 215, in this instance a plurality of through mounted LEDs. The printed circuit board is coated with a coating material, for instance a conformed coating.

The printed circuit board 230 is set in and electronics section 200 of similar doughnut shape. A barrier sheet 240 is placed over the LEDs such that a portion of the lens component 550 of each of the LEDs protrudes through. A waterproofing compound 270 fills the electronics section 200 up to the barrier sheet 240. When the jet water feature 10 is in operation, water passes into the water channel 500 through inlet 510 at a high velocity, passing through a nozzle in the hole in the printed circuit board 230 and out through an outlet 520 resting just below the surface of the pool. The at least one LED 215, in this case an array staggered about the doughnut shaped printed circuit board 230, is in contact with and provides light directly into the water channel 500 as the water passes over and through the jet water feature 10. The water is projected out of the water outlet 520 into the air with the desired lighting effect. This exemplary embodiment of the instant invention can be utilized within any water feature as mentioned herein, alone or in conjunction with further exemplary embodiments of the instant invention. The at least one LED 215, may be one or any combination of the LEDs previously mentioned. Similarly, the board configuration depicted may be modified to suit the water feature design constraints and multiple boards may be utilized without departing from the spirit of the invention.

Figure 5:
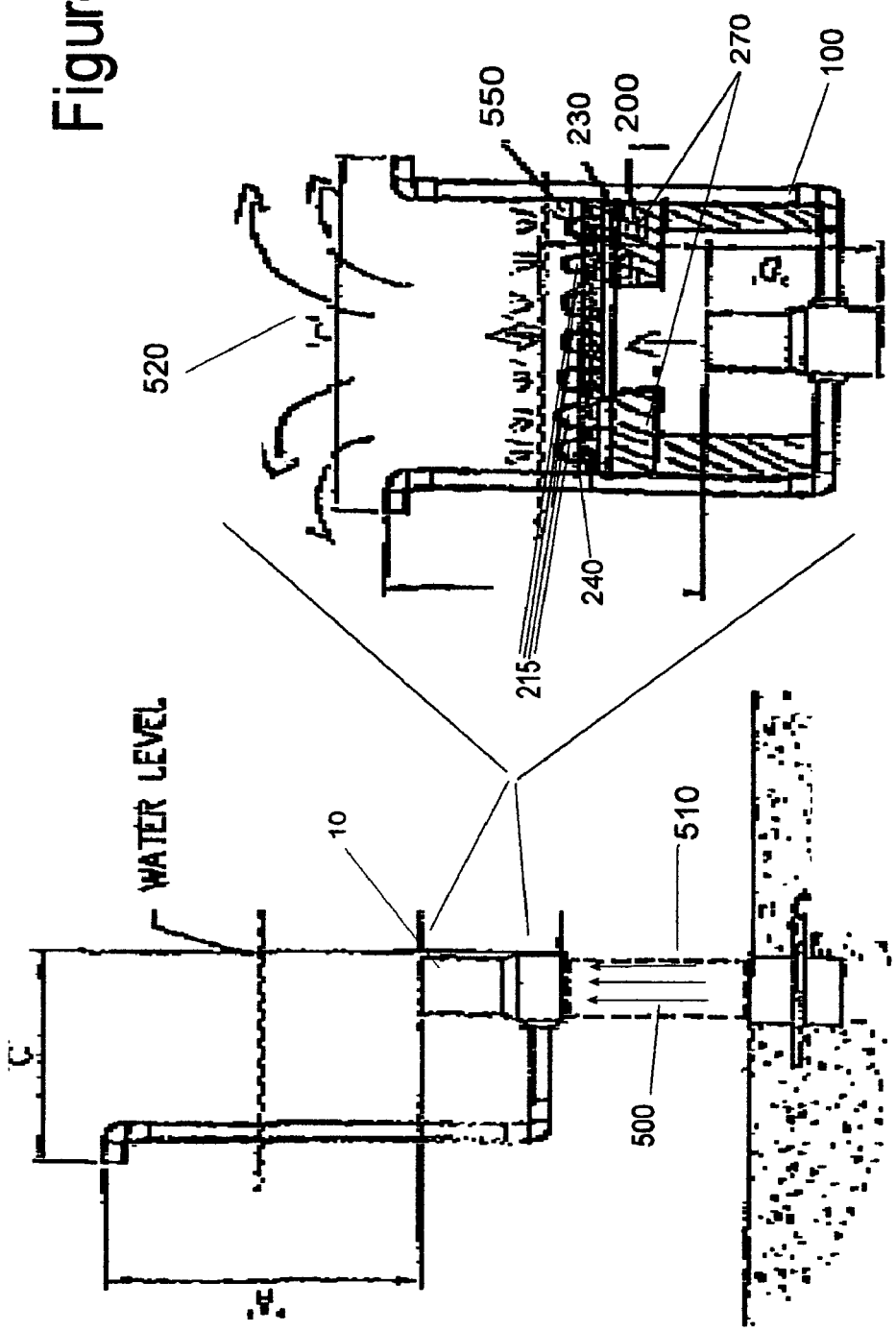
FIG. 5 shows a cross-sectional view of a still further exemplary embodiment of a water feature employing the instant invention.

FIG. 5 shows a cross-sectional view of a still further exemplary embodiment of a water feature employing the instant invention. In the embodiment shown, a bubbler nozzle water feature 10 is submerged in water, for instance in a fountain, the nozzle having a housing 100. Again, the printed circuit board 230 is a doughnut shape to accommodate water being pumped up through the water channel 500 of the bubbler nozzle water feature 10. The at least one LED 215 is an array of LEDs through mounted on the printed circuit board 230. The printed circuit board 230 is set in a doughnut shaped electronics section 200 to accommodate the electronic components of this exemplary embodiment. A barrier sheet 240 is placed over the at least one LED, in this case the plurality of LEDs, such that a portion of the lens component 550 of each of the LEDs protrudes through. A waterproofing compound 270 can then be used to fill the electronics section 200 up to the barrier sheet 240 and water proof the components contained therein.

The water passes into the bubbler nozzle water feature 10 through a water intake 510 and is pumped along the water channel 500, up and around the at least one LED 215. The LED lens component 550 is in direct contact with the water and emits its light directly into the water flow. The water flow, thus lit, is passed out a water outlet 520, and moves to the surface, providing a desirable lighting effect. This exemplary embodiment of the instant invention can be utilized within any water feature as mentioned herein, alone or in conjunction with further exemplary embodiments of the instant invention. The at least one LED 215, may be one or any combination of the LEDs previously mentioned. Similarly, the board configuration depicted may be modified to suit the water feature design constraints and multiple boards may be utilized without departing from the spirit of the invention.

Figure 6:
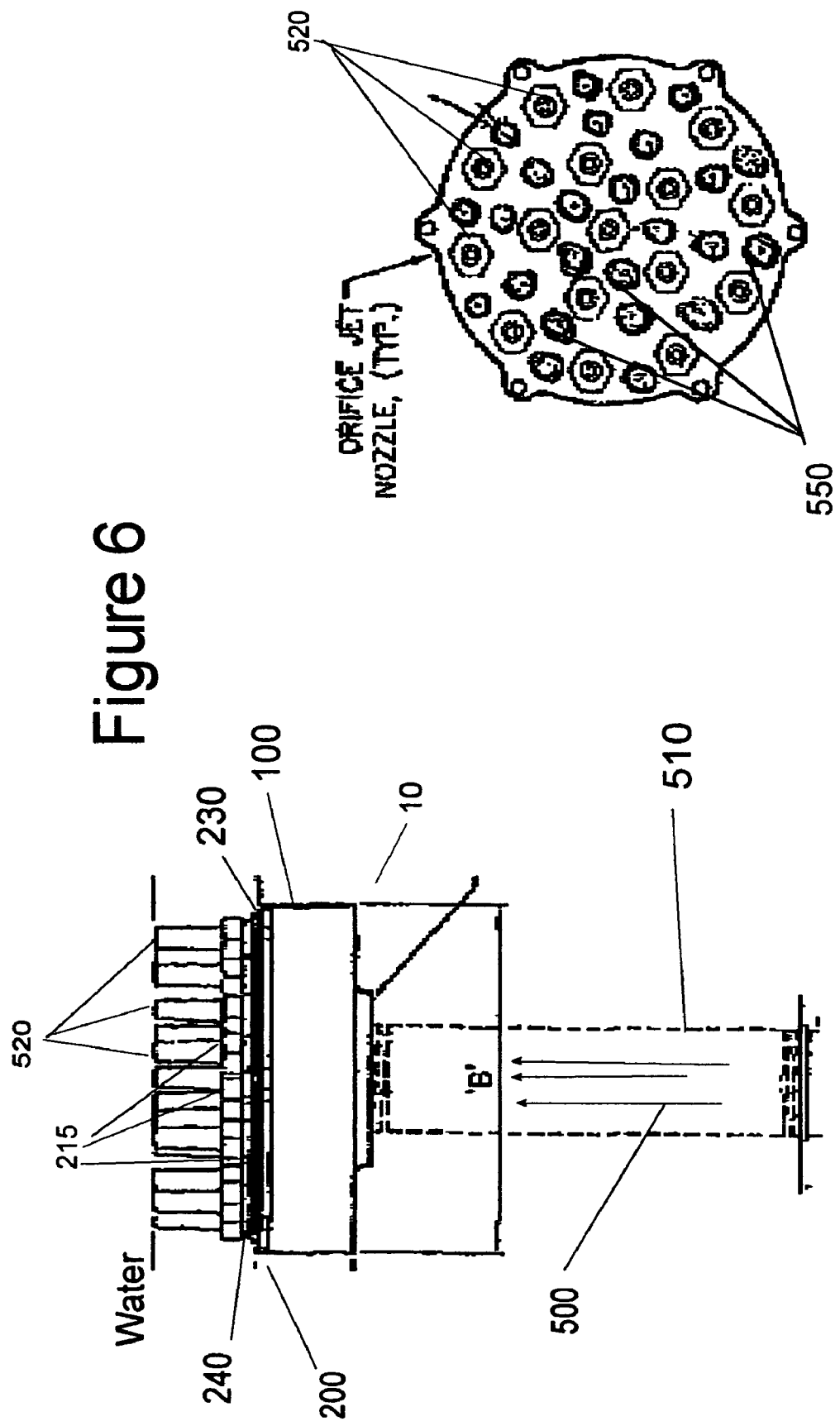
FIG. 6 shows a cross-sectional view of another exemplary embodiment of the instant invention.

FIG. 6 shows a cross-sectional view of another exemplary embodiment of the instant invention. This feature is another jet with a plurality of outlet tips and is typically set in a body of water, protruding from the surface of the water. The housing 100 of the water feature includes a plurality of water outlets 520. Water is drawn into the jet through water inlet

510. Within the housing 100 of the water feature 10 an electronics section 200 is provided as a cavity near the top of the housing 100. A printed circuit board 230, barrier sheet 240 and an at least one LED 215 are provided as shown. In this instance the at least one LED 215 is a plurality of panel mounted LEDs that protrude through the barrier sheet 240. The lens component 550 of the panel mount LEDs protrude through the top of housing 100 and into the water just below the plurality of outlet jets 520, as seen in FIG. 6. As the water passes through the plurality of outlets 520 it is lit from below by the light issuing from the lens component 550 of the at least one LED 215, in this case the plurality of LEDs, to provide a pleasing lighting effect.

Figure 7:
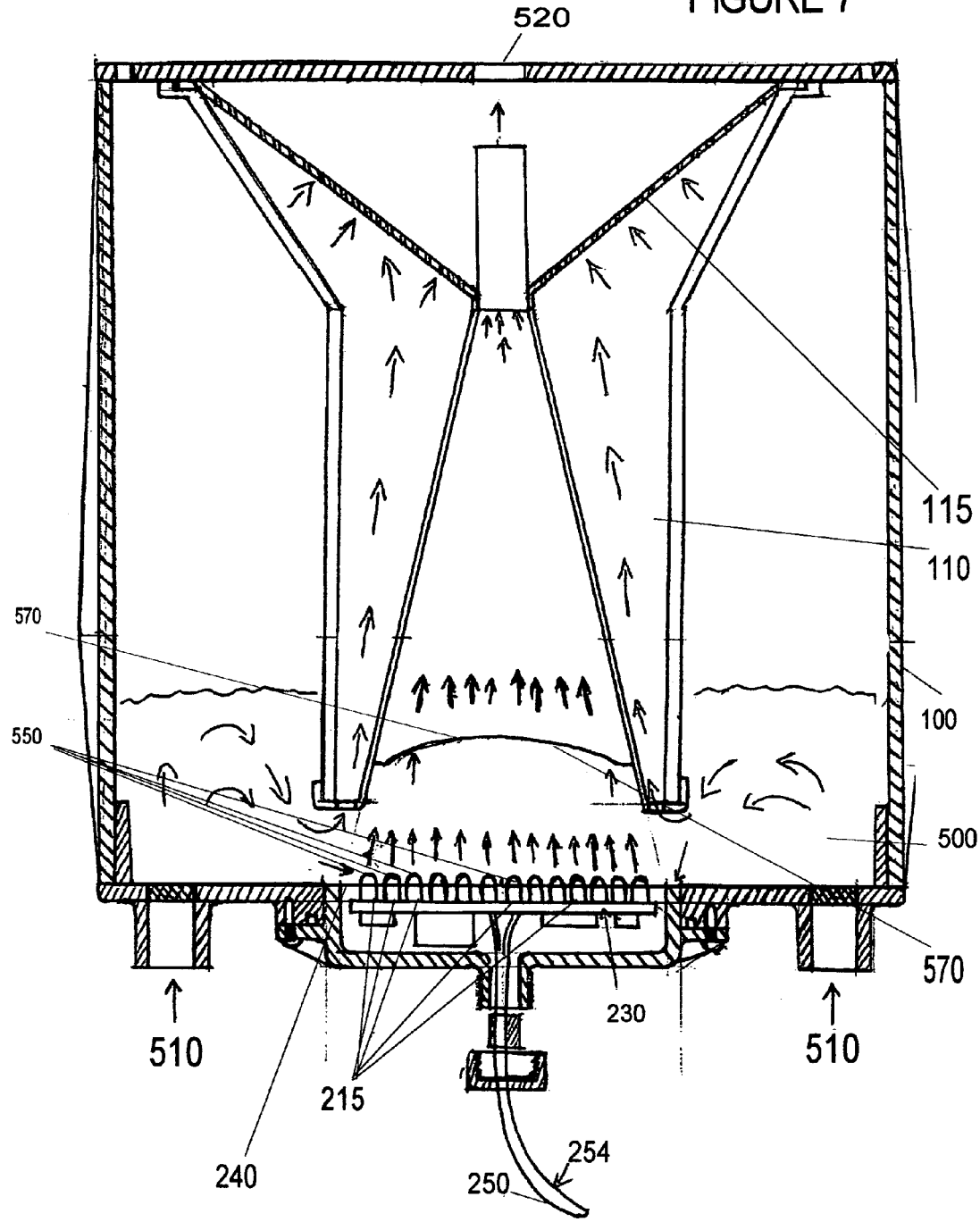
FIG. 7 shows a cross-sectional view yet another exemplary embodiment of a water feature employing the instant invention.

FIG. 7 shows a cross-sectional view yet another exemplary embodiment of a water feature employing the instant invention. A laminar flow water jet water feature 10 is shown and includes a housing 100 with multiple water inlets 510. The laminar flow water jet water feature may be mounted within or without of a standing pool of water. The water passes from the water inlets 510 into the water channel 500 by being pumped through the multiple water inlets 510. The water inlets 510 feed the water into an inner chamber 110, the inner chamber passing the water up through a series of filters 115 to reduce turbulence in the water channel 500.

As the water passes up the inner chamber 110 it passes over an at least one LED 215, in this instance a plurality of LEDs surface mounted on a circular printed circuit board 230. A circular electronics section 200 is provided in a cavity at the base of the housing 100. The printed circuit board 230 includes a controller lead 254 and the electrical lead 250 and the electronics on one side and on the printed circuit board 230. On the other side the printed circuit board 230 a plurality of LEDs 215, in a staggered circular patterned array, are surface mounted to the printed circuit board 230. The barrier sheet 240 covers the side of the printed circuit board 230 with the plurality of LEDs 215 and the electronics section 200 is filled with a waterproof compound 270. The lens component 550 of the at least one LED, in this case the plurality of surface mounted LEDs, is in contact with the water and emits the full luminosity into the water.

Figure 8:
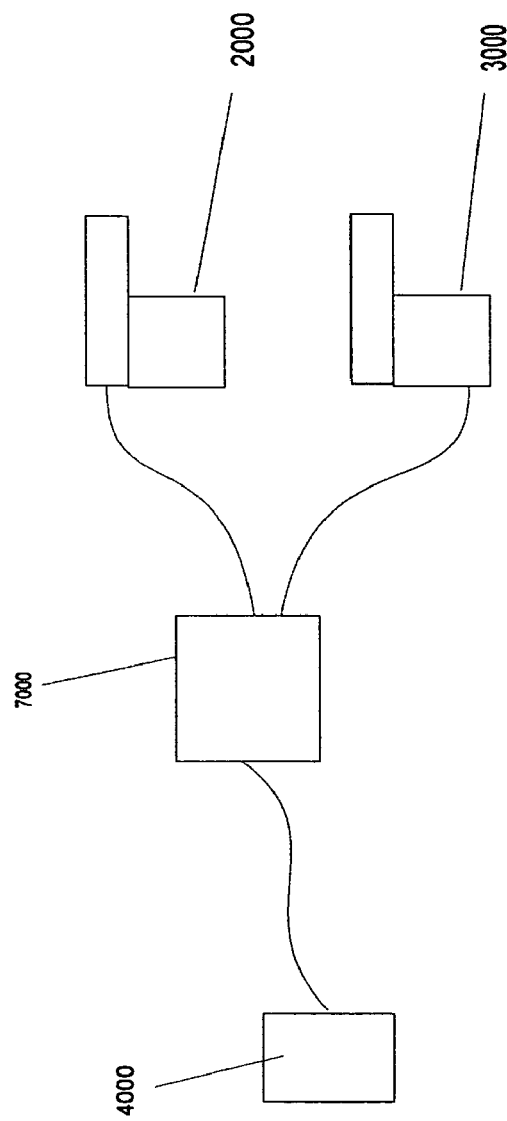
FIG. 8 shows a schematic for several exemplary embodiments of the instant invention controlled by master control.

As the water moves through the inner chamber 110 of the housing 100 it passes over the plurality of LEDs 215, which emit light directly in the water. The emitted light is focused by a lens 570 toward the outlet 510. The outlet 510 shoots a laminar tube of water from the water feature. The light reflects within the emitted laminar tube, providing a pleasing visual effect. This exemplary embodiment of the instant invention can be utilized within any water feature as mentioned herein, alone or in conjunction with further exemplary embodiments of the instant invention. The at least one LED 215 may be one or any combination of the LEDs previously mentioned. Similarly, the board configuration depicted may be modified to suit the water feature design constraints and multiple boards may be utilized without departing from the spirit of the invention FIG. 8 shows a schematic for several exemplary embodiments of the instant invention controlled by master control. In the exemplary embodiments shown in FIG. 8, the at least one LED 215 in at least one of the water features 2000, 3000, 4000, can be controlled from master control 7000 which is independent of any one of the particular water features. The master controller 7000 can be placed away from the individual water features 2000, 3000, 4000 and will control the water feature lighting from the location it is placed. This can be done by normal wired connection or wirelessly. The independent or master controller 7000 will also has the ability to control multiple water features to create a wide variety of pleasing water effects and color effects at the multiple water features.

The embodiments and examples discussed herein are non-limiting examples. The invention is described in detail with respect to preferred embodiments, and it will now be apparent from the foregoing to those skilled in the art that changes and modifications may be made without departing from the invention in its broader aspects, and the invention, therefore, as defined in the claims is intended to cover all such changes and modifications as fall within the true spirit of the invention.

What is claimed is:

1. A water feature comprising:
 a housing having an electronics section and a water channel with water;
 a printed circuit board;
 an at least one light emitting diode (LED) coupled to the printed circuit board with at least a portion of the at least one LED in direct contact with the water while the electronics section remains waterproof and;
 a waterproof barrier member between the printed circuit board and the at least one LED, wherein the portion of the LED that is in contact with the water protrudes through the barrier member and the electronics section is filled with a waterproof compound.

2. The water feature of claim 1, wherein the water feature is an at least one a nozzle, a jet, a funnel, a fountain, a waterfall, a laminar jet, a bubbler, a cascade fountain, a water sheet, a waterfall, a water curtain feature, a pool, a spa, a tub, a pond, a sprinkler, or a water cannon.

3. The water feature of claim 1, further comprising a barrier member between the printed circuit board and the at least one LED, the portion of the at least one LED in direct contact with the water extending through the barrier member.

4. The water feature of claim 3, wherein the barrier member is comprised of one of at least one of a plastic, a rubber and a composite material.

5. The water feature of claim 1, further comprising a waterproof compound filling the electronics section.

6. The water feature of claim 1, wherein the waterproof compound filling the electronics section encases the components held within the electronics section up to the barrier member.

7. The water feature of claim 1, wherein the water feature is in or on a swimming pool, spa, pond, lake, or fountain.

8. The water feature of claim 1, wherein the at least one LED is an at least one of a high intensity and a super-high intensity LED.

9. The water feature of claim 1, wherein the at least one LED is at least one of a through mount, surface mount, PC mount and panel mount LED.

10. The water feature of claim 1, wherein the at least one LED is at least one of a single color, multi-color, and multiple color LED.

11. The water feature of claim 1, wherein the at least one LED is at least one of a flashing LED and a non-flashing LED.

12. The water feature of claim 1, wherein the at least one LED is an at least one LED array.

13. The water feature of claim 1, wherein the at least one LED array is at least one of a single color LED array, a multi-color LED array, a multiple color LED array, a poly-LED array, and a cluster LED array.

14. The water feature of claim 1, wherein the water feature is coupled to a body of water.

15. The water feature of claim 1, wherein the portion of the at least one LED in contact with the water extends from the electronics section through the housing to the water channel.

16. The water feature of claim 1, wherein the portion of the at least one LED in contact with the water extends from the electronics section through the housing to a body of water.

17. The water feature of claim 1, further comprising a controller.

18. The water feature of claim 17, wherein the controller is mounted on the printed circuit board.

19. The water feature of claim 17, wherein the controller is external to the water feature and is coupled to the printed circuit board to control the at least one LED.

20. The water feature of claim 19, wherein the external controller is coupled to a plurality of water features and controls them simultaneously.

21. The water feature of claim 17, wherein the controller is coupled by terrestrial wire to the printed circuit board.

22. The water feature of claim 17, wherein the controller is wirelessly coupled to the printed circuit board.

23. The water feature of claim 1, wherein the portion of the at least one LED in contact with the water extends from the electronics section through the housing to the water channel or to the body of water.

24. A method of lighting a water feature with an LED lighting system comprising the method steps of:
　placing an at least one LED on a printed circuit board;
　applying a waterproof barrier member that separates the printed circuit board from the water in the water feature;
　inserting the printed circuit board with the at least one LED and the barrier member into a water feature;
　positioning the printed circuit board within the water feature such that at least a portion of the at least one LED is in direct contact with a water channel within or a body of water about the water feature during operation and where the portion of the LED that is in contact with the water protrudes through the barrier member; and
　passing water about the water feature or through the water channel within the water feature; and
　illuminating the water with at least one LED via a low-voltage electrical circuit coupled through the printed circuit board.

25. The method of claim 24, further comprising the method step of controlling the at least one LED.

26. The water feature of claim 24, wherein the method step of controlling the at least one LED further comprises controlling the at least one LED to vary the output of the at least one LED and achieve a lighting effect.

27. The water feature of claim 24, further comprising the method step of sealing from the water the portion of the LED and the printed circuit board not in contact with the water.

28. The water feature of claim 27, wherein the method step of sealing off from the water channel the portion of the LED and printed circuit board not in contact with the water channel further comprises encasing the LED and printed circuit board not in contact with the water channel in a waterproofing material behind the barrier member.

29. The water feature of claim 24, further comprising the method step of coating the board with a conforming coating.

30. A water feature comprising:
　a housing having an electronics section and a water channel;
　a printed circuit board;
　an at least one light emitting diode (LED) coupled to the printed circuit board with at least a portion of the at least one LED in direct contact with the water while the electronics section remains waterproof and wherein the water feature is submerged in a body of water.

31. The water feature of claim 30, wherein the water is an at least one a nozzle, a jet, a funnel, a fountain, a waterfall, a laminar jet, a bubbler, a cascade fountain, a water sheet, a waterfall, a water curtain feature, a pool, a spa, a tub, a pond, a sprinkler, or a water cannon.

32. The water feature of claim 30, further comprising a barrier member between the printed circuit board and the at least one LED, the portion of the at least one LED in direct contact with the water extending through the barrier member.

33. The water feature of claim 30, further comprising a waterproof compound filling the electronics section.

34. The water feature of claim 33, wherein the waterproof compound filling the electronics section encases the components held within the electronics section up to the barrier member.

35. The water feature of claim 30, wherein the water feature is submerged in or on a swimming pool, spa, pond, lake, or fountain as the body of water.

* * * * *